United States Patent

Baggen et al.

Patent Number: 5,297,153
Date of Patent: Mar. 22, 1994

[54] METHOD AND APPARATUS FOR DECODING CODE WORDS PROTECTED WORDWISE BY A NON-BINARY BCH CODE FROM ONE OR MORE SYMBOL ERRORS

[75] Inventors: Constant P. M. J. Baggen, Eindhoven; Lodewijk B. Vries, deceased, late of Valkenswaard, both of Netherlands, by Henricus J. Kunnen, legal representative

[73] Assignee: U.S. Philips Corporation, New York, N.Y.

[21] Appl. No.: 911,252

[22] Filed: Jul. 7, 1992

Related U.S. Application Data

[63] Continuation of Ser. No. 570,098, Aug. 20, 1990, abandoned.

[30] Foreign Application Priority Data

Aug. 24, 1989 [EP]  European Pat. Off. ........ 89202139.5

[51] Int. Cl.$^5$ .............................................. G06F 11/10
[52] U.S. Cl. .................. 371/37.1; 371/38.1; 371/39.1
[58] Field of Search .............. 371/37.1, 38.1, 39.1

[56] References Cited

U.S. PATENT DOCUMENTS

| | | | |
|---|---|---|---|
| 4,099,160 | 7/1978 | Flagg | 371/37.1 |
| 4,642,808 | 2/1987 | Baggen | 371/37.1 |
| 4,649,541 | 3/1987 | Lahmeyer | 371/37.1 |
| 4,665,523 | 5/1987 | Citron | 371/37.1 |
| 4,683,572 | 7/1987 | Baggen | 371/37.5 |
| 4,694,455 | 9/1987 | Koga | 371/37.1 |
| 4,841,300 | 6/1989 | Yoshida | 371/37.1 X |
| 4,866,716 | 9/1989 | Weng | 371/37.1 |
| 4,897,839 | 1/1990 | Yamagishi | 371/37.1 |

OTHER PUBLICATIONS

Robert Redinbo; "Speedier Decoding of Cyclic Codes Using Chord Properties"; IEEE Transactions on Information Theory; vol. 34, No. 4, Jul. 1988; pp. 793-802.

*Primary Examiner*—Robert W. Beausoliel, Jr.
*Assistant Examiner*—Ly V. Hua
*Attorney, Agent, or Firm*—Leroy Eason

[57] ABSTRACT

A method and apparatus for decoding code words which are error protected by a non-binary BCH-code against at least one symbol error. Upon reception of an input code word a syndrome information thereof is generated under control of code defining information. From the syndrome information, a key equation is set up and solved for generating an error locator polynomial sig (z) and an error evaluator polynomial w(z). On the basis of the polynomial sig (z) and its formal derivative polynomial sig' (z), Euclid's algorithm is employed to calculate two accessory polynomials b(z), c(z), such that $b(z)sig(z)+c(z)sig'(z)=1$. From these, a Lagrangian polynomial L(z) is calculated which for any inversed error location value has the associated error symbol value. The error data is then calculated by evaluating the error locator polynomial and the Lagrangian polynomial.

4 Claims, 2 Drawing Sheets

$$c(z) = \sum_{i=0}^{n-1} c_i z^i = c_0 + c_1 z + c_2 z^2 + \cdots + c_{n-1} z^{n-1}$$

$$\underline{c} \in C \iff c(z) = m(z) \cdot g(z).$$

Forney: $Y_i = \dfrac{-w(X_i^{-1})}{\text{sig}'(X_i^{-1})}.$

METHOD AND APPARATUS FOR DECODING CODE WORDS PROTECTED WORDWISE BY A NON-BINARY BCH CODE FROM ONE OR MORE SYMBOL ERRORS

This is a continuation of application Ser. No. 07/570,098, filed Aug. 20, 1990, now abandoned.

BACKGROUND OF THE INVENTION

1. Field of the Invention

The present invention relates to a decoding method for decoding code words that are wordwise protected by a non-binary BCH code against at least one symbol error. In most practical codes, each symbol contains a string of at least two bits. More generally, however, the cardinality of the symbol set is at least three. The invention is applicable to non-primitive BCH-codes as well as to primitive BCH-codes. In a primitive code the code length is exactly $(2^n-1)$. In a non-primitive code the length can be any odd integer, the code being nevertheless still a well at to non-narrow-sense BCH-codes. The invention is applicable to full-length codes as well as to shortened or punctuated BCH-codes. All these exemplary sub-categories are considered well-known in the art and will not be explained in detail. The derivation hereinafter will only be given for one particular sub-category, to wit, a primitive, narrow-sense BCH-code. Extension to more general BCH-codes is straightforward. A further sub-category of BCH-codes are Reed-Solomon codes, wherein the finite field associated with the code symbols and the finite field for the decoding calculations are identical. In contradistinction thereto, the code symbols may also be defined as a sub-field of the field that is used for the calculations. The present invention applies to both categories. As far as the invention is concerned, the symbols have more than two possible values, which means that localizing an error also necessitates finding the error value. As used herein and in the ensuing claims, the term "error value" refers to the symbol value to be included in a decoding code word at a location therein ("error location") at which a symbol error is present in the received code word being decoded. The invention particularly suits codes that have a high distance, and thus could, in principle, correct many symbol errors in each code word.

2. The Generally Related Art

A particular method according to the above foregoing has been disclosed in U.S. Pat. No. 4,642,808 assigned to the same assignee. The code therein is a distance 21 code using 8-bit symbols, and is a Reed-Solomon code. Such method, while improving on classical correction methods by in particular accelerating the decoding for a low number of symbol errors, still requires a rather long processing time and/or the use of complicated or special purpose hardware, when for example more than three errors occur.

SUMMARY OF THE INVENTION

Among other things, it is an object of the present invention to provide a decoding method which particularly, but not exclusively in the case of relatively large numbers of symbol errors, provides acceleration and/or simplification of the decoding. According to a first aspect, the invention provides a decoding method for a non-binary BCH-code which provides code word protection against at least one symbol error, by the steps of:

a. receiving a protected code word and generating therefrom, under control of code defining information, a syndrome information;

b. in response to the syndrome information setting up and solving a key equation for generating an error locator polynomial sig(z) and an error evaluator polynomial w(z);

c. using Euclid's algorithm and on the basis of the error locator polynomial sig(z) and its formal derivative sig'(z), calculating first and second accessory polynomials b(z), c(z), such that $$b(z)\cdot sig(z)+c(z)\cdot sig'(z)=1;$$

d. generating an intermediate polynomial L*(z) based on the error locator polynomial, its formal derivative, the error evaluator polynomial, and the second accessory polynomial c(z), according to:

$$L^*(z) = -w(z)\cdot c(z) = \frac{-w(z)\{1 - b(z)\cdot sig(z)\}}{sig'(z)}$$

e. generating a Lagrange polynomial L(z) as the minimal degree polynomial for any error occurrence according to:

$$L(z)=L^*(z) \bmod sig(z);$$

the Lagrange polynomial for any inversed error location value providing the associated error value;

f. evaluating the error locator polynomial sig(z) to obtain a set of error locations in the received word which, upon substitution in the Lagrange polynomial, generates an associated set of error values;

g. outputting a set of error data, each error data including an error location value and the associated error value.

The invention also relates to decoder apparatus for executing the decoding method.

BRIEF DESCRIPTION OF THE DRAWINGS

A preferred embodiment of the invention is further explained, with respect to the appended drawings. First, the code is explained briefly; next a prior art decoding method is shown, followed by a detailed description of the preferred embodiment. In the Figures

DESCRIPTION OF RELATED ART DECODING

Figure 1:
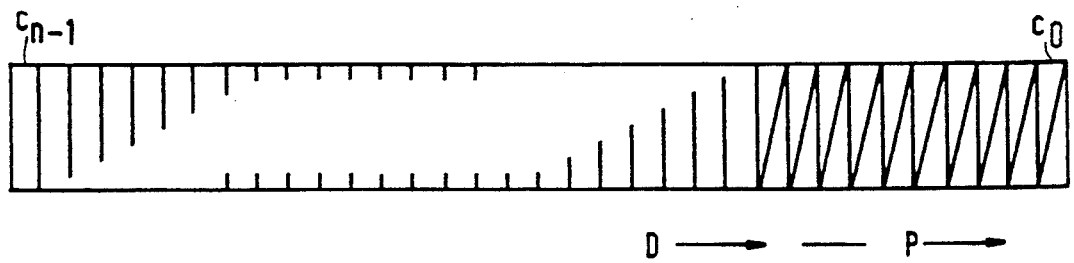
FIG. 1 shows schematically a format of a code word.

FIG. 1 schematically shows a format of a code word which consists, by way of example, of n symbols (e.g., n=32) of eight bits each, $c_o \ldots c_{n-1}$, that have been numbered from right to left. The word has 22 data symbols D and ten parity symbols P, all symbols being shown as blocks. The code word can be expressed as a vector $c=(c_o \ldots c_{n-1})$ or, according to the first formula A in FIG. 1, in polynomial notation. Each code word is a multiple of a generator polynomial g(z), as shown in the second formula in FIG. 1, m(z) also being a polynomial. The zeroes of the generator polynomial define the distance properties, and thus the amount of error protection, of the code. Decoding can be received as assigning to each received word a best-fitting code word.

Figure 2:
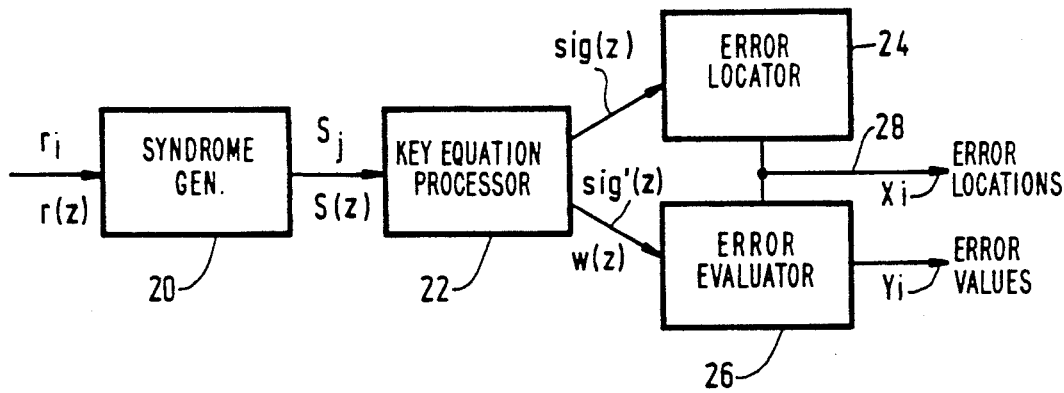
FIG. 2 shows the decoding method according to the prior art.

FIG. 2 is a typical block diagram of so-called time-domain decoding according to prior art such as the above-cited patent. The input is the actual, possibly erroneous word, as represented by either vector ($r_i$) or polynomial ($r(z)$) notation. It is received by syndrome generator 20 which may comprise elementary hardware to evaluate $r(z)$ for the zeroes of the generator polynomial $g(z)$ to thereby generate what is commonly called the weighted power sum symmetric functions denoted $S_j$, or syndrome polynomial $S(z)$. The syndrome can be determined by standard polynomial evaluation or residue calculations by means of hardware that is relatively simple in comparison to the so-called "random" division hardware to be discussed hereinafter. As an alternative, syndrome determination may be effected with hardware which to an appreciable extent corresponds to hardware used for encoding, in which case the device calculates $r(z)$ and $\mod g(z) = \text{rem}(z)$. This remainder polynomial $\text{rem}(z)$ has degree $d-1$, where $d$ is the distance of the code. Both representations $\text{rem}(z)$, $S(z)$ contain the same information; from $\text{rem}(z)$, the power sum symmetric functions $S_j$ can easily be obtained by polynomial evaluation.

Block 22 represents apparatus for establishing and solving of the key equation, for example, according to the Berlekamp-Massey algorithm which computes the error locator polynomial $\text{sig}(z)$ and the error evaluator polynomial $w(z)$, as described in Berlekamp's Book "Algebraic Coding Theory", Algorithm 7.4.

An alternative has been described in Mc. Eliece, "Theory of information and Coding", p. 175. In general, operations necessary thereto require multiplications and divisions of factors that each can have arbitrary values in the Galoid field $GF(q^m)$, wherein the decoding calculations are executed. Usually, such apparatus has a processor-like structure with all associated features, such as ALU, register set, control store, and I/O organization. Another possible realization could be as a systolic array. In both realizations, block 22 would be of an appreciable complexity.

Block 24 receives the error locator polynomial $\text{sig}(z)$ and is a so-called Chien search device. In elementary operations which, although representing a completely different function, on a level of technical implementation resemble the syndrome formation, there the values of $\text{sig}(z)$ are calculated in a prespecified set of points in the Galois field $GF(q^m)$. Any zero of $\text{sig}(z)$ is so found would correspond to an associated error location. Thus, at output 28 any error location information $X_i$ may be output for further use. The referenced patent U.S. Pat. No. 4,642,808 discloses various shortcuts to the calculations of these error locations by obviating or streamlining the Chien search, based on algebraic analysis and statistical considerations.

Block 26 receives from block 22 the error evaluator polynomial $w(z)$, from block 24 the various error locations found, and also, either directly as a sub-quantity of $\text{sig}(z)$ or after a separate calculation in block 22, the formal derivative polynomial $\text{sig}'(z)$. For the case wherein all symbols are bit strings, this formal derivative in fact consists of the even-numbered components of $\text{sig}(z)$, which is to be evaluated at the various error locations.

Block 26 executes the standard Forney algorithm. For narrow-sense BCH codes this boils down to for each error location which has found executing the division of $-w(z)$ evaluated at such error location by the formal derivative polynomial $\text{sig}'(z)$ also evaluated at such error location. For a treatise with a broader scope than the present disclosure, but on the readily accessible knowledge level of an engineer or student, reference is had to R. E. Blahut, the Theory and Practice of error control codes, Addison Wesley 1983, pp. 183-191. It should be noted that the algorithm embodiment of the present disclosure is applicable to narrow-sense BCH-codes, but modifications to allow for other categories of code would be straightforward. In particular, they would not change for decoding method described herein in any material way. Now, the above dividing requires dividing two random-valued symbols, and could, in principle, require a similar processor structure as in block 22. The output of block 26 yields the respective error values $Y_i$.

Thus, the second division in block 26 is a complicating factor. If block 24 is also realized as a (third) processor, and blocks 22, 24, 26 are mapped on a single hardware structure in a time-multiplex organization, the resulting operating speed is low. If the Chien search is done in specific hardware, many I/O operations between the three subsystems would be necessary, which would just as well be time-consuming. On the other hand, a speed-up may be effected by executing block 26 as a fast hardware divider. Then, however, a very large device would result (e.g. table look-up for eight-bit symbols would require a $64k \times 8 = \frac{1}{2}$ Mb ROM). The underlying problem is the essential pipelining organization among blocks 24 and 26. The latter cannot operate before the error locations have been found. The basic calculation performed by block 26 is represented by the Forney expression in FIG. 2. The quotient of these two evaluated polynomials cannot be written as the evaluation of a quotient polynomial, because in general the latter is not of finite degree in $z$.

DESCRIPTION OF A PREFERRED EMBODIMENT

Now, one of the measures taken by the present invention is based on the realization that the numerator of the above Forney expression may, before the evaluations, be changed by adding (or subtracting) any other polynomial in $z$, provided that this other polynomial have zero value at the zeroes of the error locator polynomial. This would be valid, regardless of the contribution of this other polynomial at other locations than those zeroes.

Figure 3:
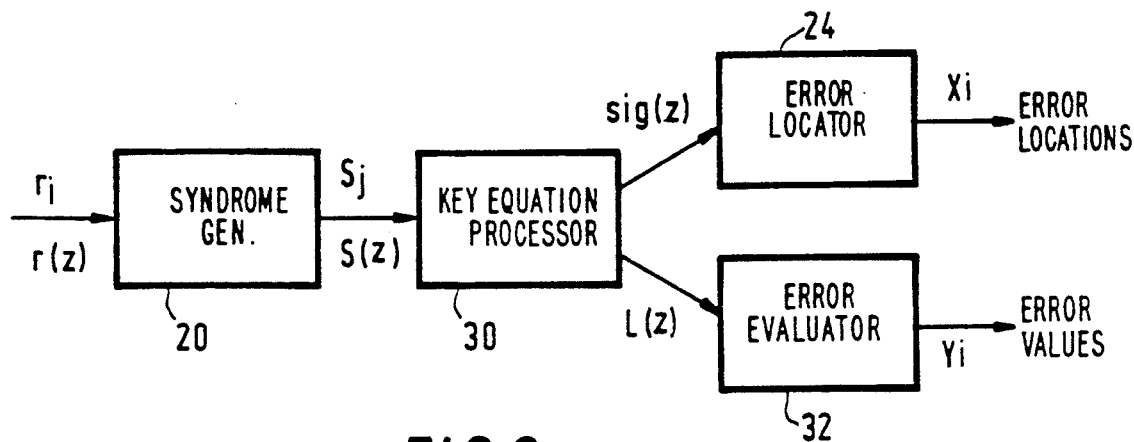
FIG. 3 shows the novel decoding method according to the present invention.

FIG. 3 schematically shows the decoding according to the present invention. Various elements correspond to FIG. 2 and carry identical labels. As shown, blocks 20, 24 and also the data communicated $r_i/r(z)$; $S_j/S(z)$; $\text{sig}(z)$; $X_i$ correspond both as to their hardware content and as to their formulation.

Block 30 however uses the so-called Euclid's algorithm, which for two polynomials $S(z)$, $t(z)$ calculates two other accessory polynomials $a(z)$, $b(z)$ to yield the following expressions for their greatest common divisor GCD:

$$GCD[S(z), t(z)] = a(z)S(z) + b(z)t(z).$$

The use thereof is described by Blahut, op cit., p. 193 ff. However, the present invention in first instances uses Euclid's algorithm for another purpose than Blahut does, to wit, in a replacement box 30 instead of box 22. Now, block 30 generates a new polynomial $L(z)$, the Lagrange polynomial, which for each discrete i in the interval [1,t], t being the maximum error correcting capability, satisfies $L(X_i^{-1})=Y_i$, and $Y_i$ representing the corrected error value associated with a respective error position value given by $X_i$. Now, the quantity $L(z) = -w(z) \cdot c(z) \mod \text{sig}(z)$, where $b(z)\text{sig}(z) + c(z) \cdot \text{sig}'(z) = 1$. It should be noted that for any correctable error pattern, i.e., one that no repeated roots, the greatest common divisor of $\text{sig}(z)$ and $\text{sig}'(z)$ is exactly 1, which allowed up to apply Euclid's algorithm in the first place.

Reiterating, by means of Euclid's algorithm, first and second accessory polynomials $b(z)$, $c(z)$ are calculated; next, by means of the second accessory polynomial $c(z)$ an intermediate polynomial $L^*(z)$ is generated as also based on the error locator polynomial $\text{sig}(z)$, its formal derivative $\text{sig}'(z)$, and the error locator polynomial $w(z)$ according to $$L^*(z) = -w(z) \cdot c(z) = \frac{-w(z)\{1 - b(z) \cdot \text{sig}(z)\}}{\text{sig}'(z)}$$

Finally a Lagrange polynomial $L(z)$ is found as the minimal degree polynomial through any error, in that for any inversed error location it has the associated error value;

$$L(z) = L^*(z) \mod \text{wig}(z).$$

Now, evaluation of the error locator polynomial $\text{sig}(z)$ produces a set of error locations in the received word, which error locations by substitution in the above Lagrange polynomial $L(z)$ yield an associated set of error values. The execution of all of the above operation is realized as respective straightforward implementation of the associated equations and expressions.

As explained supra, a first aspect of the invention is to use Euclid's algorithm, by itself well-known, for calculating the polynomial $c(z)$. Next, the invention may go a step further in that Euclid's algorithm also be used for solving the key equation in block 30, in lieu of using the Berlekamp/Massey algorithm of block 22. Alternately, block 30 contains both Euclid's algorithm implemented and also Berlekamp/Massey's. In neither instance is retrocoupling or sequencewise I/O between blocks 24, 30, 32 necessary, making the set-up ideal for pipelining.

The above has been limited to errors-only decoding, wherein the error locator polynomial would dictate the positions where the system should calculate the errors (if any). In combined error plus erasure decoding, or in erasure-only decoding, the locations are wholly or partly specified by external information, such as demodulation error flags, or other pointer-like information. This produces a modified key equation, as taught by Blahut op. cit Block 30 should receive the relevant indicators or erasure locator polynomial. The modified key equation requires a modified algorithm, which, however, leaves the principles of the remaining operation unchanged. For brevity, the extra input to block 30 has been omitted.

DETAILED DESCRIPTION OF ILLUSTRATIVE

Figure 4:
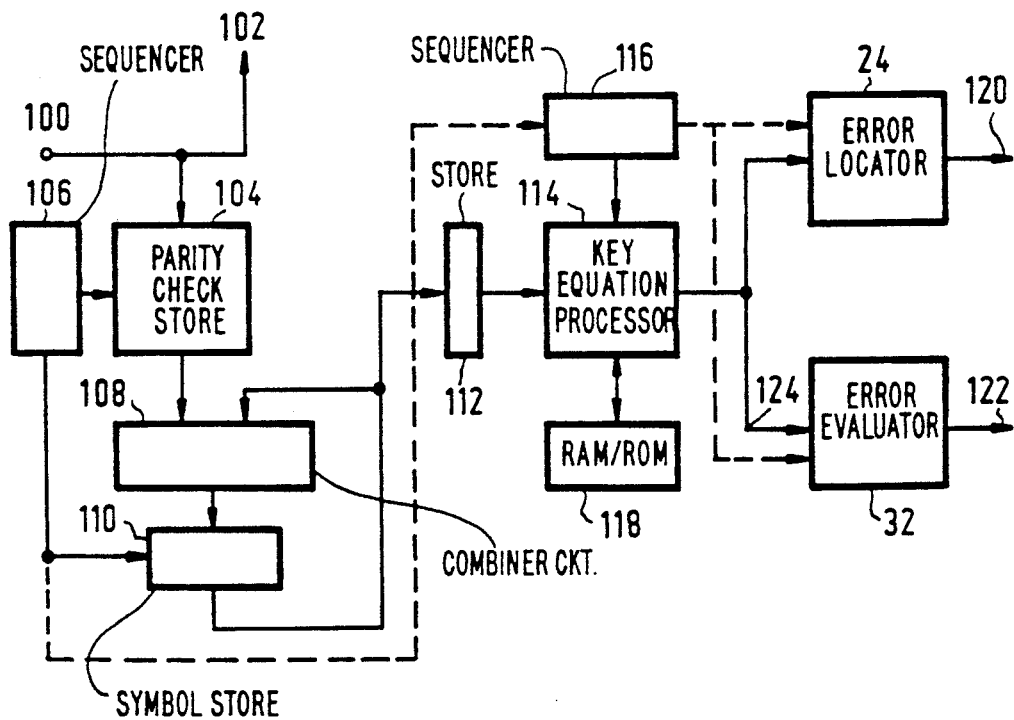
FIG. 4 shows an apparatus for practising the novel decoding method.

FIG. 4 shows an exemplary apparatus for practicing the decoding; it should be noted that especially on the hardware level the invention allows a wide variation as to special/general purpose, embedding/non-embedding and various other realizations. The input word symbols are received on input 100; deinterleaving, demodulation are ignored for brevity. Block 104 stores the code defining information, such as, for example, the elements of the parity check matrix. Sequencer 106 controls a selection from the information in block 104 to combine this with any input symbol to calculate its contribution to the syndrome symbol string. Provisional syndrome symbols are stored in element 110. Again under control of sequencer 106, the provisional syndrome is combined in a combiner circuit 108 with the updating contribution thereto. When the syndrome symbol string has been completed, it is transferred to storage element 112 which is signalled by a further sequencer 116. Thereupon, the next input word may be processed. The user symbols of the code word, and, if required, the parity symbols are fed to output 102 for further storage or otherwise. The above completes description of hardward for performing the functions of block 20 in FIG. 3. Sequencer 116 now controls processor 114 to set up and solve the key equation as based on the syndrome symbol string or its polynomial equivalent representation in storage element 112. This produces the error locator polynomial $\text{sig}(z)$. Local RAM and, possibly, ROM storage block 118 allows for containing intermediate data and program information. The same subsystems also allow for applying Euclid's algorithm as explained supra, either with respect to solving the key equation, or to calculate the polynomial $c(z)$ with respect to both $\text{sig}(z)$ and its formal derivative polynomial $\text{sig}'(z)$. Thereupon the Lagrange polynomial $L(z)$ is produced. Upon finalization of those polynomials $\text{sig}(z)$, $L(z)$, sequencer 116 signals so to blocks 24, 32, and in conjunction therewith, the two polynomials are transmitted from processor 114 to the latter blocks. Of course, such transmission may be effected by means of respective point-to-point lines. The operations in blocks 24, 32 are straightforward evaluations, so no further details have been given. Further no details have been given on handshaking for synchronization purposes between the respective sub-systems. On output 120 the error location value $X_i$ is produced, and on output 122 the error value $Y_i$. If applicable a separate output may be provided for signalling an incorrectable codeword, for example, under control of an error location pointing to a non-existent code symbol of a shortened code. Further, a separate input could be provided to control the decoding, for example, in that two or more different decoding strategies are selectable. Finally, signalling information as to the reliability on a symbol level could be in/output. All of the latter refinements are standard knowledge, see for example U.S. patent application Ser. No. 653,255 assigned to the same assignee, herein incorporated by reference, which has issued into U.S. Pat. No. 4,683,572 on Jul. 28, 1987, and no further details have been given here.

In the above system, the error data are specifically output as symbols. Any other output system would be feasible as well, such directly using the error data for effecting code word correction, outputting the error data in polynomial form, and other.

We claim:
1. A method of decoding a series of electrical signals which represent non-binary BCH-code words each of which includes data symbols and parity symbols, the parity symbols of a code word providing protection against at least one data symbol error in such code word; said method comprising the steps of:
   a. receiving a protected code word and, in accordance with code defining information, generating error locating and error evaluating syndrome information relating to said code word;
b. processing the syndrome information in accordance with a key equation and solving said key equation so as to derive an error locator polynomial sig(z) and an error evaluator polynomial w(z);
c. deriving a formal derivative polynomial sig'(z) of the error locator polynomial sig(z), and using Euclid's polynomial algorithm to derive from said two polynomials sig(z) and sig'(z) first and second accessory polynomials b(z) and c(z) such that $$b(z) \cdot sig(z) + c(z) \cdot sig'(z) = 1;$$

d. generating an intermediate polynomial L*(z) from the error locator polynomial sig(z), the formal derivative polynomial sig'(z), the error evaluator polynomial w(z), and the second accessory polynomial c(z), according to:

$$L^*(z) = -w(z) \cdot c(z) = \frac{-w(z)\{1 - b(z) \cdot sig(z)\}}{sig'(z)};$$

e. generating a Lagrange polynomial L(z) which is a minimal degree polynomial for inversed errors in said code word, in accordance with:

$$L(z) = L^*(z) \bmod sig(z),$$

said Lagrange polynomial for any inversed error location signifying an error value at such location;
f. evaluating the error locator polynomial sig(z) so as to derive a set of error locations in said code word which, upon substitution in said Lagrange polynomial, results in a set of error values associated with said set of error locations; and
g. outputting said set of error values and the error locations associated therewith in the form of electrical signals.

2. A method as claimed in claim 1, wherein Euclid's polynomial algorithm is also used in step (b) for solving said key equation.

3. Apparatus for decoding a series of electrical signals which represent non-binary BCH code words each of which includes data symbols and parity symbols, the parity symbols of a coded word of a code word providing protection against at least one data symbol error in such code word, said apparatus comprising:
syndrome generating means for receiving a protected code word and, in accordance with code defining information, generating a series of at least two syndrome symbols representing error locating and error evaluating syndrome information relating to such code word;
processing means for processing the series of syndrome symbols generated by said syndrome generator in accordance with a key equation and solving said key equation so as to generate an error locator polynomial sig(z) and an error evaluator polynomial w(z), said processing means comprising:
Euclid's algorithm means for receiving said error locator polynomial sig(z) and deriving a formal derivative polynomial sig'(z) thereof which has no common divisor therewith other than unity, and applying Euclid's polynomial algorithm to said sig(z) and sig'(z) polynomials to derive therefrom first and second accessory polynomials b(z), c(z) such that $$b(z) \cdot sig(z) + c(z) \cdot sig'(z) = 1,$$

and
Lagrangian algorithm means for receiving said error locator polynomial sig(z), said formal derivative polynomial sig'(z), said error evaluator polynomial w(z) and said first accessory polynomial b(z), and deriving therefrom an intermediate polynomial L*(z) given by $$L^*(z) = -w(z) \cdot c(z) = \frac{-w(z)\{1 - b(z) \cdot sig(z)\}}{sig'(z)},$$

and a Lagrangian polynomial L(z) given by $$L(z) = L^*(z) \bmod sig(z),$$

said Lagrangian polynomial L(z) for any inversed error location signifying an error value at such location;
first evaluating means for receiving the error locator polynomial sig(z) from said processing means and generating therefrom a set of error locations in said protected code word;
second evaluating means for receiving the Lagrangian polynomial L(z) from said processing means and generating therefrom a set of error values associated with said set of error locations; and
output means coupled to said first and second evaluating means for outputting said set of error values and the error locations associated therewith in the form of electrical signals.

4. Decoder apparatus as claimed in claim 3, wherein said processing means uses said Euclid's algorithm means to also solve said key equation in accordance with Euclid's polynomial algorithm.

* * * * *